United States Patent
Xia (10) Patent No.: US 9,871,077 B2
(45) Date of Patent: Jan. 16, 2018

(54) RESISTIVE MEMORY DEVICE WITH SEMICONDUCTOR RIDGES

(71) Applicant: University of Massachusetts, Boston, MA (US)

(72) Inventor: Qiangfei Xia, Amherst, MA (US)

(73) Assignee: University of Massachusetts, Boston, MA (US)

( * ) Notice: Subject to any disclaimer, the term of this patent is extended or adjusted under 35 U.S.C. 154(b) by 351 days.

(21) Appl. No.: 14/563,375

(22) Filed: Dec. 8, 2014

(65) Prior Publication Data

US 2016/0351256 A1 Dec. 1, 2016

Related U.S. Application Data

(60) Provisional application No. 61/912,717, filed on Dec. 6, 2013.

(51) Int. Cl.

| | | |
|---|---|---|
| *G11C 11/00* | (2006.01) | |
| *H01L 27/24* | (2006.01) | |
| *H01L 45/00* | (2006.01) | |
| *G11C 13/00* | (2006.01) | |

(52) U.S. Cl.
CPC ...... *H01L 27/2463* (2013.01); *G11C 13/0002* (2013.01); *G11C 13/0014* (2013.01); *G11C 13/0023* (2013.01); *G11C 13/0069* (2013.01); *H01L 27/2409* (2013.01); *H01L 45/1233* (2013.01); *H01L 45/1273* (2013.01); *H01L 45/145* (2013.01); *H01L 45/1675* (2013.01); (Continued)

(58) Field of Classification Search
CPC .............. G11C 13/004; G11C 2213/52; G11C 2213/34; G11C 2213/33; G11C 2013/0045; H01L 27/2463; H01L 45/1233; H01L 45/1253; H01L 45/145; H01L 45/1608
USPC ........................................................ 365/148
See application file for complete search history.

(56) References Cited

U.S. PATENT DOCUMENTS

| | | | | |
|---|---|---|---|---|
| 8,320,157 B2 * | 11/2012 | Ichihara | ............. | G11C 13/0007 365/148 |
| 2007/0133358 A1 * | 6/2007 | Kubo | ..................... | B82Y 10/00 369/13.38 |

OTHER PUBLICATIONS

Akinaga et al., "Resistive random access memory (ReRAM) based on metal oxides", Proc. IEEE, vol. 98:2237-2251 (2010).

(Continued)

*Primary Examiner* — Tha-O H Bui
(74) *Attorney, Agent, or Firm* — Fish & Richardson P.C.

(57) ABSTRACT

A memory device includes one or more first semiconductor ridges formed on a first semiconductor wafer. The first semiconductor ridges are configured to be first electrodes. The memory device also includes one or more second semiconductor ridges formed on a second semiconductor wafer. The second semiconductor ridges are configured to be second electrodes and are placed orthogonally on top of the first semiconductor ridges forming a crossbar structure, with sharp edges of the first semiconductor ridges coupled to sharp edges of the second semiconductor ridges. Each area of coupling of a first semiconductor ridge and a second semiconductor ridge is configured to be a memory cell. In addition, the memory device includes a compound layer covering the sharp edges of at least one of the first semiconductor ridges or the second semiconductor ridges. The compound layer is configured to be a switching layer.

12 Claims, 6 Drawing Sheets

(52) U.S. Cl.
CPC ...... *G11C 2213/33* (2013.01); *G11C 2213/52* (2013.01); *G11C 2213/77* (2013.01)

(56) References Cited

OTHER PUBLICATIONS

Avila et al., "Switching in coplanar amorphous hydrogenated silicon devices", Solid State Electron., vol. 44:17-27 (2000).
Baek et al., "Multi-layer cross-point binary oxide resistive memory (OxRRAM) for post-NAND storage application", Proc. Electron Device Meeting, San Francisco, CA, Dec. 2005, pp. 750-753.
Buck, D. A., "Ferroelectrics for Digital Information Storage and Switching", MIT, Report R-212 (1952).
Chou et al., "Imprint lithography with 25-nanometer resolution", Science, vol. 272L85-87 (1996).
Ghadarghadr et al., 3D nanostructures by stacking pre-patterned fluid-supported single-crystal Si membranes, J. Vac. Sci. Technol., vol. B 29:06F401 (2011).
Ha et al., "Adaptive oxide electronics: A review", Journal of Appl. Phys., vol. 10:071101 (2011).
Hu et al., "Switching and filament formation in hot-wire CVD p-type a-Si:H devices", Thin Solid Films, vol. 430:249-252 (2003).
Jo et al., "High-density crossbar arrays based on a Si memristive system", Nano Lett., vol. 9:870-874 (2009).
Johnson et al., "Hybrid Ferromagnetic Semiconductor Nonvolatile Gate", IEEE Trans. Magn., vol. 34:1054-1059 (1998).
Lecomber et al., "The Switching Mechanism in Amorphous Silicon Junctions", J. Non-Cryst. Solids vol. 77-78:1373-1382 (1985).
Patel et al., "3D fabrication by stacking prepatterned, rigidly held membranes", J. Vac. Sci. Technol., vol. B 29:06F402 (2011).
Pickett et al., "Switching dynamics in titanium dioxide memristive devices", J. Appl. Phys., vol. 106:074508 (2009).
Price, J. B., "Anisotropic Etching of Silicon With KOH-H2O-Isopropyl Alcohol", J. Electrochem. Soc. 120, C96 (1973).
Simmons et al., "New Conduction and Reversible Memory Phenomena in Thin Insulating Films", Proc. R. Soc. London, Ser. A, vol. 301:77-102 (1967).
Strukov et al., Four-dimensional address topology for circuits with stacked multilayer crossbar arrays:, PNAS, vol. 106:20155-20158 (2009).
Strukov et al., "The missing memristor found", Nature, vol. 453:L80-83 (2008).
Topol et al., "Three-dimensional integrated circuits", IBM J. Res. & Dev., vol. 50:491-506 (2006).
Waser et al., "Nanoionics-based resistive switching memories", Nature Materials, vol. 6:833-840 (2007).
Wong, H. S. P., "Beyond the conventional transistor", IBM J. Res. Dev., vol. 46:133-168 (2002).
Xia et al., "Impact of geometry on the performance of memristive nanodevices", Nanotechnology, vol. 22:254026 (2011).
Xia, Qiangfei, "3D All-Silicon-Based RRAM", vol. 1: Technical & Management Proposal, Fiscal Year 2012 DARPA Young Faculty Award (YFA), Contract Reference No. GPID #15376 (Jan. 12, 2012).
Yang et al., "Memristive switching mechanism for metal/oxide/metal nanodevices", Nat. Nanotechnol., vol. 3:429-433 (2008).
Yao et al. "Resistive switches and memories from silicon oxide", Nano Lett., vol. 10:4105-4110 (2010).

* cited by examiner

RESISTIVE MEMORY DEVICE WITH SEMICONDUCTOR RIDGES

RELATED APPLICATIONS

This patent application is related to, and claims priority to and the full benefit of, the following United States provisional patent application, which is incorporated herein in its entirety: Ser. No. 61/912,717, filed Dec. 6, 2013, and titled "Resistive Memory."

GOVERNMENT FUNDING

This invention was made with government support under Defense Advanced Research Projects Agency (DARPA) grant N66001-12-1-4217. The government has certain rights in the invention.

TECHNICAL FIELD

This disclosure relates to resistive memory devices and systems, and methods for making the same.

BACKGROUND

Memory devices include volatile and non-volatile memory devices. Volatile memory devices include dynamic random access memory (DRAM) and static RAM (SRAM). Non-volatile memory devices include flash memory. These memory devices are implemented using transistors.

SUMMARY

In a general aspect, a memory device includes one or more first semiconductor ridges formed on a first semiconductor wafer. The first semiconductor ridges are configured to be first electrodes. The memory device also includes one or more second semiconductor ridges formed on a second semiconductor wafer. The second semiconductor ridges are configured to be second electrodes and are placed orthogonally on top of the first semiconductor ridges forming a crossbar structure, with sharp edges of the first semiconductor ridges coupled to sharp edges of the second semiconductor ridges. Each area of coupling of a first semiconductor ridge and a second semiconductor ridge is configured to be a memory cell. In addition, the memory device includes a compound layer covering the sharp edges of at least one of the first semiconductor ridges or the second semiconductor ridges. The compound layer is configured to be a switching layer.

Particular implementations may include one or more of the following features. At least one of the first semiconductor ridges or the second semiconductor ridges may include silicon ridges.

At least one of the first semiconductor wafer or the second semiconductor wafer may include silicon dioxide ($SiO_2$) on silicon-on-insulator (SOI) wafer. The compound layer may be one of a silicon oxide ($SiO_x$) layer or a hydrogen silsesquioxane (HSQ) layer.

At least one of the first semiconductor ridges or the second semiconductor ridges may include semiconductor contact pads on both ends of the semiconductor ridges. The semiconductor contact pads may be configured to fix the semiconductor ridges in position on the associated semiconductor wafer. The semiconductor contact pads may include silicon contact pads.

Additional semiconductor ridges may be stacked on top of the crossbar structure, forming a three-dimensional crossbar array. The second semiconductor ridges may be formed of metal that is selected from the group consisting of platinum (Pt), copper (Cu), silver (Ag), palladium (Pd) or tungsten (W). The compound layer may have a thickness in an order of nanometers (nm).

The first electrodes may be connected to ground and the second electrodes may be connected to a voltage source. A first voltage applied to the compound layer may be in a range of −2.6 volt to +0.6 volt for a set state. A second voltage applied to the compound layer may be in a range of −1.3 volt to −0.9 volt for a reset state.

In another general aspect, a resistive memory device is fabricated by immersing a semiconductor wafer into a first acidic solution. The semiconductor wafer is treated in a second acidic solution for a predetermined time period. A compound layer is formed on a surface of the semiconductor wafer based on treating the semiconductor wafer in the second acidic solution for the predetermined time period. A metal disk of predetermined thickness and diameter is deposited on the compound layer. Deposition of the metal disk includes applying a predetermined pressure at a known deposition rate that corresponds to a type of metal associated with the metal disk.

Particular implementations may include one or more of the following features. The semiconductor wafer may include a doped silicon wafer. Immersing the doped silicon wafer into the first acidic solution may include immersing the doped silicon wafer into a 1:50 diluted hydrogen fluoric (HF) acid solution.

The semiconductor wafer may include a doped silicon wafer. Treating the doped silicon wafer in the second acidic solution for a predetermined time period may include treating the doped silicon wafer in a 3:1 volume ratio solution of sulfuric acid to hydrogen peroxide (3:1 volume ratio of $H_2SO_4:H_2O_2$) for a time period of 20 minutes.

Depositing the metal disk of predetermined thickness and diameter may include depositing the metal disk with a thickness in a range of 12 to 24 nanometers and diameter in a range of 25 to 200 microns ($\mu m$).

The metal may be selected from the group consisting of silicon (Si), platinum (Pt) and copper (Cu). Applying a predetermined pressure at a known deposition rate may include applying a base pressure in a range of $7 \times 10^{-7}$ torr, and applying a deposition rate in a range of 0.2 angstrom (Å) per second for platinum and 1.0 angstrom per second for copper.

The compound layer may be one of a silicon oxide ($SiO_x$) layer or a hydrogen silsesquioxane (HSQ) layer. Forming the compound layer may comprise forming the compound layer with a thickness in a range of nanometers.

The semiconductor wafer may be connected to ground. The semiconductor wafer may be configured to act as a first electrode. The metal disk may be connected to a voltage source. The metal disk may be configured to act as a second electrode. The silicon oxide layer may be configured as a switching layer by applying a first voltage that ranges from −2.6 volts for platinum to +0.6 volts for copper, wherein the silicon oxide layer is configured to be in a set state. A second voltage may be applied that ranges from −0.9 volts for platinum to 1.3 volts for copper, wherein the silicon oxide layer is configured to be in a reset state.

In another general aspect, a memory device includes one or more first semiconductor ridges coupled to a first semiconductor wafer using contact pads. The first semiconductor ridges are configured to be wordlines. The memory device includes one or more second semiconductor ridges coupled to a second semiconductor wafer using contact pads and placed orthogonally on top of the first semiconductor ridges forming a crossbar structure, with sharp edges of the first semiconductor ridges coupled to sharp edges of the second semiconductor ridges. The second semiconductor ridges are configured to be bitlines. Each area of coupling of a first semiconductor ridge and a second semiconductor ridge is configured to be a memory cell. The memory device also includes a compound layer covering the sharp edges of at least one of the first semiconductor ridges or the second semiconductor ridges. The compound layer is configured to be a switching layer.

In addition, the memory device includes a ground connection coupled to the first semiconductor ridges, and a voltage source coupled to the second semiconductor ridges for application of a switching voltage to the compound layer. Each memory cell is operable to be in a set state by application of a first voltage and operable to be in a reset state by application of a second voltage using the voltage source and the ground connection.

Particular implementations may include one or more of the following features. At least one of the first semiconductor ridges or the second semiconductor ridges may include silicon ridges. At least one of the first semiconductor wafer or the second semiconductor wafer may include silicon dioxide ($SiO_2$) on silicon-on-insulator (SOI) wafer. The compound layer may be one of a silicon oxide ($SiO_x$) layer or a hydrogen silsesquioxane (HSQ) layer.

The semiconductor contact pads may include silicon contact pads. The second semiconductor ridges may be formed of metal that is selected from the group consisting of platinum (Pt), copper (Cu), silver (Ag), palladium (Pd) or tungsten (W). The compound layer may have a thickness in an order of 1 nanometer.

The first voltage may be in a range of −2.6 volt to +0.6 volt, and the second voltage may be in a range of −1.3 volt to −0.9 volt. An area of a memory cell may be in a range of $4F^2$, wherein F is a minimum feature size.

In another general aspect, a memory device includes one or more first semiconductor ridges formed on a first semiconductor wafer. The first semiconductor ridges are configured to be first electrodes. The memory device also includes one or more second semiconductor ridges formed on a second semiconductor wafer. The second semiconductor ridges are configured to be second electrodes and are placed orthogonally on top of the first semiconductor ridges forming a crossbar structure, with sharp edges of the first semiconductor ridges coupled to sharp edges of the second semiconductor ridges. Each area of coupling of a first semiconductor ridge and a second semiconductor ridge is configured to be a memory cell. The memory device also includes a compound layer covering the sharp edges of at least one of the first semiconductor ridges or the second semiconductor ridges. The compound layer is configured to be a switching layer.

Particular implementations may include one or more of the following features. At least one of the first semiconductor ridges or the second semiconductor ridges may include silicon ridges. At least one of the first semiconductor wafer or the second semiconductor wafer may include silicon dioxide ($SiO_2$) on silicon-on-insulator (SOI) wafer.

The compound layer may be one of a silicon oxide ($SiO_x$) layer or a hydrogen silsesquioxane (HSQ) layer. At least one of the first semiconductor ridges or the second semiconductor ridges may include silicon contact pads on both ends of the silicon ridges. The silicon contact pads may be configured to fix the silicon ridges in position on the associated semiconductor wafer.

The compound layer may have a thickness in an order of nanometers (nm). A switching voltage applied to the memory device may be in a range of −2.6 volt to +0.6 volt for switching a state of the compound layer. Additional silicon ridges may be stacked on top of the crossbar structure, forming a three-dimensional crossbar array.

In another general aspect, a memory device comprises one or more first ridges formed on a first semiconductor wafer. The first ridges are formed using a semiconductor material and are configured to be first electrodes. The memory device includes one or more second ridges that are placed orthogonally on top of the first semiconductor ridges forming a crossbar structure, with sharp edges of the first ridges coupled to sharp edges of the second ridges. The second ridges are configured to be second electrodes and each area of coupling of a first ridge and a second ridge is configured to be a memory cell. The memory device includes a compound layer covering the sharp edges of at least one of the first ridges or the second ridges. The compound layer is configured to be a switching layer.

The resistance of the switching layer corresponding to a first memory cell is configured to be in a first state by applying a first set of voltages to a first ridge and a second ridge associated with the first memory cell. The resistance of the switching layer is configured to be in a second state by applying a second set of voltages to the first ridge and the second ridge associated with the first memory cell. The first memory cell is configured to store a first value when the resistance of the switching layer is in the first state. The first memory cell is configured to store a second value when the resistance of the switching layer is in the second state.

Particular implementations may include one or more of the following features. The memory device may comprise a memory controller that is configured to measure the resistance of the switching layer that is associated with the first memory cell. Based on measuring the resistance of the switching layer, the memory controller may determine whether the first value or the second value is stored in the first memory cell.

The second ridges may be formed using one of a semiconductor material or a metal. The semiconductor material may be silicon (Si). The metal may be one of platinum (Pt), copper (Cu), silver (Ag), palladium (Pd) or tungsten (W).

The memory device may include a voltage source that is coupled to the first ridges and the second ridges. The voltage source may be configured to apply the first set of voltages or the second set of voltages to the first ridge and the second ridge associated with the first memory cell.

The first set of voltages may include a first voltage that is applied to the first ridge associated with the first memory cell and a second voltage that is applied to the second ridge associated with the first memory cell. The first voltage may be different from the second voltage. Alternatively, the first voltage may be same as the second voltage.

The second set of voltages may include a third voltage that is applied to the first ridge associated with the first memory cell and a fourth voltage that is applied to the second ridge associated with the first memory cell. The third voltage may be different from the fourth voltage. Alternatively, the third voltage may be same as the fourth voltage. The first set of voltages may be different from the second set of voltages. Alternatively, the first set of voltages may be same as the second set of voltages.

The first set of voltages may correspond to a set voltage of the first memory cell. The second set of voltages may correspond to a reset voltage of the first memory cell. The first value or the second value, or both, stored in the first memory cell may be a binary value. The binary value may be a '0' or a '1'.

The first memory cell may store additional values that are different from the first value or the second value. The additional values may be stored by applying additional sets of voltages to the first ridge and the second ridge associated with the first memory cell. The additional values may be corresponding to additional resistance states of the switching layer that is associated with the first memory cell. The memory controller may be configured to determine whether one or more of the additional values are stored in the first memory cell by measuring additional resistance states of the switching layer. The additional values may be binary values, octal values, hexadecimal values, or some other suitable values.

Implementations of the above techniques include methods, systems and computer program products. One such system includes a processor and instructions stored in a machine-readable medium that, when executed by the processor, are operable to perform one or more of the above described actions.

One such computer program product is suitably embodied in a non-transitory machine-readable medium and includes instructions executable by one or more processors. The instructions are configured to cause the one or more processors to perform the one or more of the above-described actions.

The details of one or more disclosed implementations are set forth in the accompanying drawings and the description below. Other features, aspects, and advantages will become apparent from the description, the drawings and the claims.

DETAILED DESCRIPTION

Volatile memory devices, e.g., DRAM and SRAM, have long endurance, fast access speed and consume low power, but they require constant power to preserve information that is stored in them. On the other hand, non-volatile memory devices, such as flash memory, store information without requiring constant power, but they suffer from low endurance and slow access speed. The above are all transistor-based memory devices, which have limited scalability due to the presence of leakage current when the transistor channel becomes extremely narrow, for example in the range of micro-meters or nanometers.

The issues associated with transistor-based memory devices may be overcome by implementing non-volatile memories that utilize different physical phenomena. Examples of such non-volatile memory include ferroelectric RAM (FeRAM), magnetoresistive RAM (MRAM), and resistance random access memory, which is also known as resistive random access memory (RRAM).

Unlike transistor-based memory devices that use charge storage, RRAM devices use high and low resistance states to represent '1's and '0's associated with the stored information. Consequently, the scalability of RRAM devices is not limited by the quantum effect that is associated with transistor-based memory, but it is dependent on how small the RRAM device can be made. In addition, RRAM devices have fast switch speed; overwrite ability without erase; low power consumption; and high endurance and long data retention time. Accordingly, RRAM devices are considered as one of the most promising candidates to replace flash and DRAM memory.

However, device reliability and device-to-device performance variation can negatively impact the development of RRAM devices and their applications. Typically, RRAM devices are implemented using materials such as transition metal oxide and perovskites (e.g., strontium titanate ($SrTiO_3$), stoichiometric cubic strontium niobate ($SrNbO_3$), or calcium titanium oxide minerals) with noble or refractory metal nanowires as electrodes. These materials are not compatible with current integrated circuit devices, which are primarily based on silicon (Si).

Given the above, it may be useful to design an RRAM device that uses silicon-based materials and is implemented using standard processes. The following sections describe such an RRAM device. The programming voltages of the resultant RRAM device is comparable to that of complementary metal-oxide-semiconductor (CMOS) transistors, such that this device is compatible with the state-of-the-art integrated circuit CMOS platforms.

Figure 1:
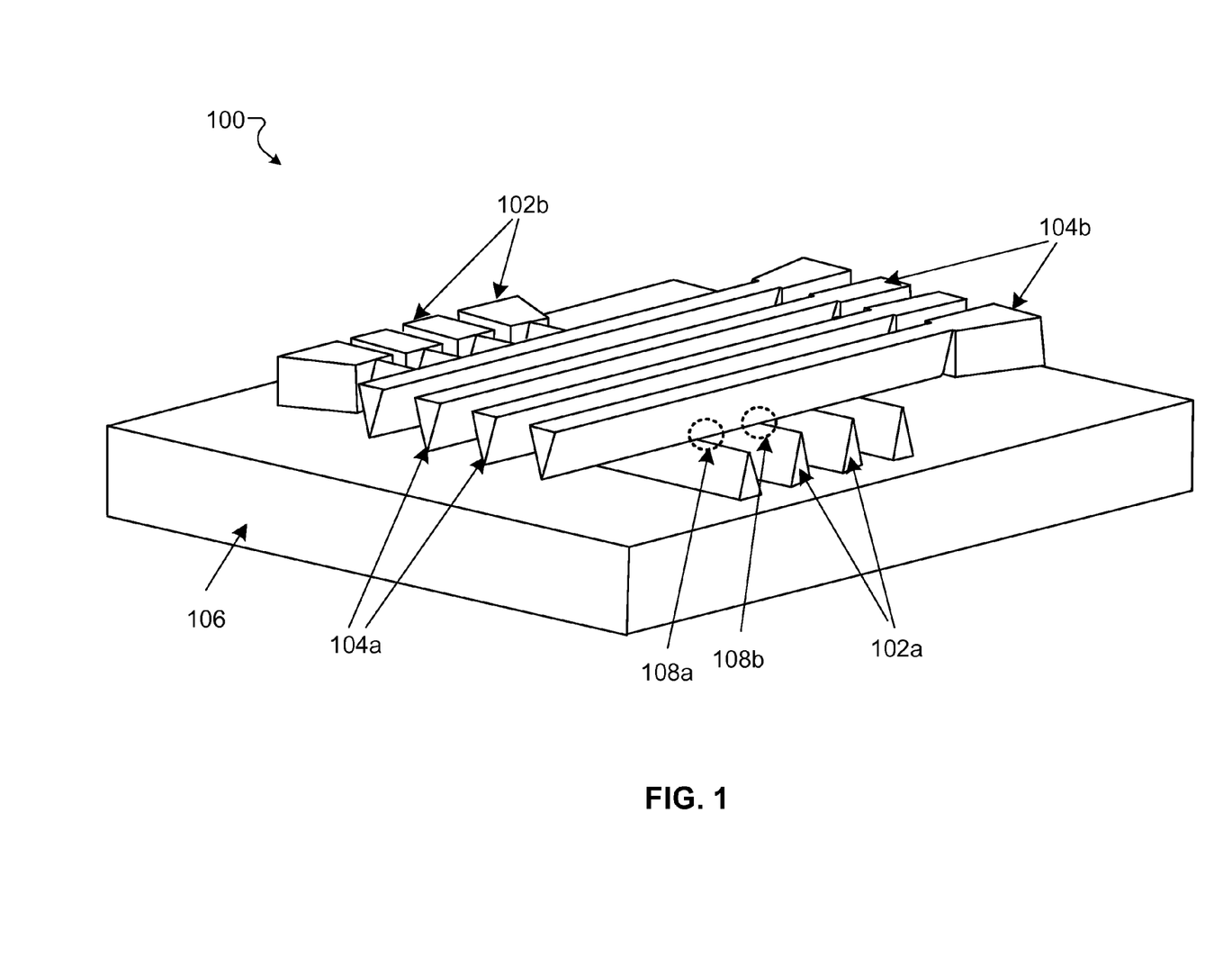
FIG. 1 is a block diagram of an all-silicon based resistive random access memory (RRAM) device.

FIG. 1 is a block diagram of an all-silicon based resistive random access memory (RRAM) device 100. The RRAM device 100 includes sets of silicon ridges 102a and 104a that are coupled to a wafer 106 using silicon contact pads 102a and 104a respectively. Memory cells 108a and 108b are formed in the RRAM device 100.

The silicon ridges 102a are place orthogonally below the silicon ridges 104a using a crossbar architecture. FIG. 1 shows a single layer of such a crossbar structure.

The ridges 102a and 104a form electrodes of the RRAM device. In some implementations, the ridges 102a, or 104a, or both are heavily doped silicon ridges. The ridges 102a, or 104a, or both are elongated structures that have an inverted 'V' or pyramidal shape in the cross-section. The silicon ridges 102a are formed with the base of the pyramid resting on the wafer 106 and the top of the pyramid, i.e., the sharp edge of each ridge, pointing upwards. The ridges 104a are formed in a reverse orientation, with the top of the pyramid, i.e., the sharp edge of each ridge, pointing downwards and resting on the top of the sharp edges of the ridges 102a.

In some implementations, the ridges 102a form wordlines and the ridges 104a form the bitlines in a RRAM memory array. However, in some other implementations, ridges 102a form bitlines and the ridges 104a form the wordlines in a RRAM memory array.

The silicon contact pads 102b and 104b respectively secure the ridges 102a and 104a to the wafer 106. In some implementations, the contact pads have a flat shape. Although only one set of contact pads is shown for each set of ridges, in some implementations, both ends of each set of ridges are fixed in position on the wafer using the contact pads.

A switching material is sandwiched between the silicon ridges 102a and 104a. In some implementations, the switching material includes a very thin surface layer of a silicon oxide (e.g., SiO$_x$, where x is a positive integer, or hydrogen silsesquioxane (HSQ)) formed on the sharp edges of the silicon ridges 102*a*, or 104*a*, or both. The thickness of the silicon oxide layer is in the order of 1 nanometer, e.g., in implementations using SiO$_x$.

As described in greater detail in the following sections, in some implementations, the silicon oxide layer is produced on the surface of the ridges 102 or 104*a* during wet cleaning. The wafer 106 includes silicon dioxide (SiO$_2$) on silicon-on-insulator (SOI) material. The sharp ridges, e.g., 102*a*, are produced by orientation-dependent anisotropic wet etch of heavily doped silicon on the wafer 106. The silicon oxide is produced during the post cleaning process using a Piranha solution (e.g., a mixture of sulfuric acid (H$_2$SO$_4$) and hydrogen peroxide (H$_2$O$_2$) in a 3:1 volume ratio). The second array of sharp ridges, e.g., 104*a*, are transferred from another wafer 106 and placed on top of the ridges 102*a*, forming the crossbar structure.

A memory cell is formed at each contact point of the ridges 102*a* and 104*a*. Due to the sharp edges of the ridges 102*a* and 104*a*, the junction area of each contact point is very small. Each memory cell, such as 108*a* and 108*b*, includes two electrodes (which are also referred to as terminals) corresponding to one ridge 102*a* and one ridge 104*a*, and the silicon oxide switching material in between the two electrodes. The effective device area of each cell 108*a* or 108*b* is determined by the extremely narrow width of silicon ridges 102 and 104*a*. The area of each cell can be as small as 4F$^2$ (where F is the minimum feature size and is in the order of nanometers). In some implementations, the area of each cell can be reduced to (4F$^2$)/n by stacking the ridges in crossbar architecture in a three-dimensional (3D) manner, with n being the number of layers of crossbar structures similar to the single crossbar layer shown in FIG. 1.

Due to the unique structure of the RRAM device 100 with silicon ridges orthogonally stacked in a crossbar arrangement, the electrical properties, scalability and reliability of the device 100 outperforms other RRAM device structures. Since only silicon-based materials and standard processes are involved, the RRAM device 100 is fully compatible with state-of-the-art CMOS platforms. In some implementations, the RRAM device 100 may be manufactured at low cost using disruptive techniques such as nano-imprint lithography (NIL) with nanometer resolution over wafer scale. As described previously, the packing density may be increased by stacking the crossbar arrays in a 3D structure.

Accordingly, the RRAM device 100 may be used in next-generation data storage, in conjunction with, or replacing, other types of non-volatile memory, such as flash memory. The RRAM device 100 also may be used for non-conventional computing with lower power consumption and faster speeds compared to implementations using transistor-based memory devices. In addition, the RRAM device 100 may be used in compact and/or fast electronic systems for civilian and military applications.

Figure 2A:
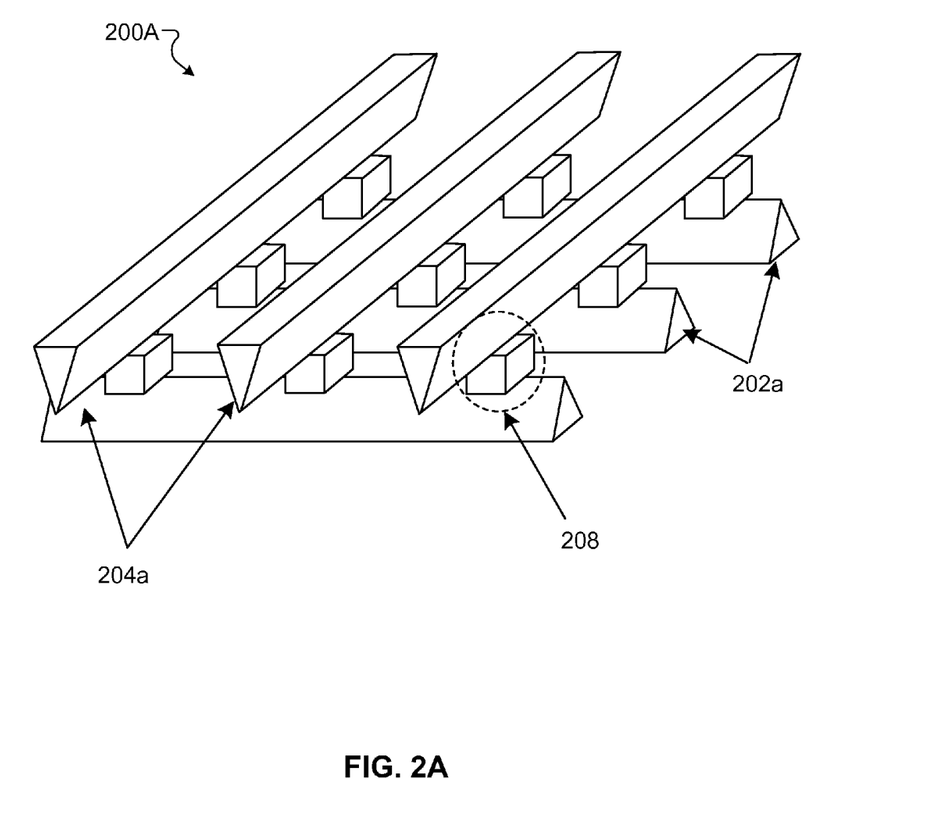
FIGS. 2A-2C are block diagrams of example all-silicon based RRAM devices that show close-ups of a memory cell.
Figure 2B:
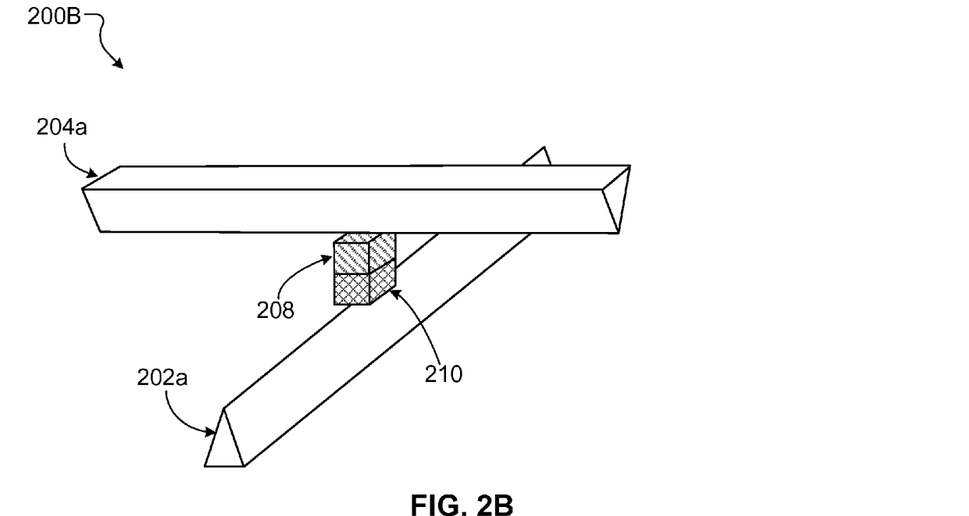
Figure 2C:
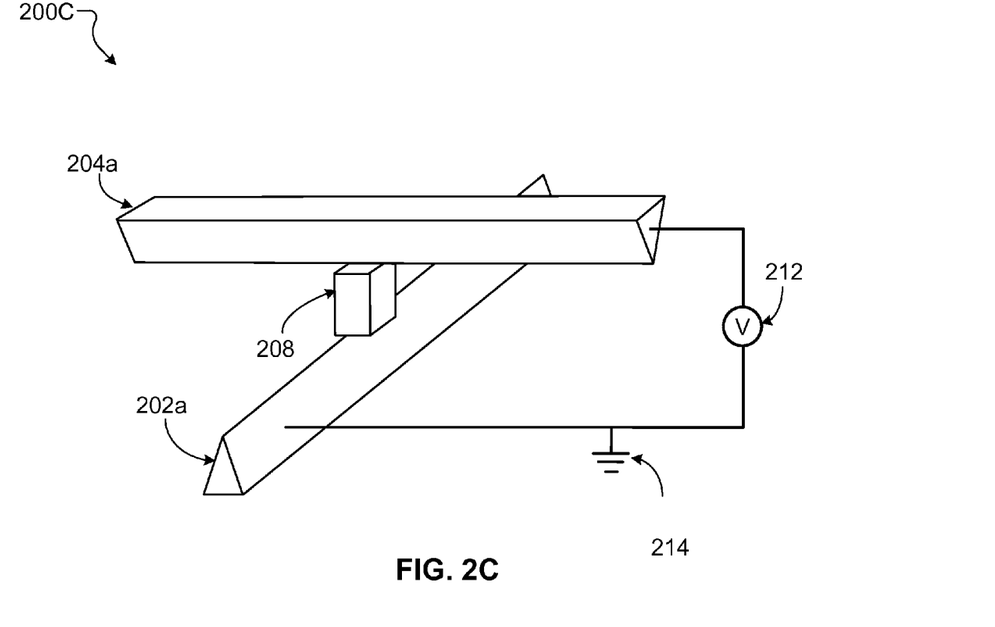

FIGS. 2A-2C are block diagrams of example all-silicon based RRAM devices 200A, 200B and 200C that show close-ups of a memory cell. As shown in FIG. 2A, the RRAM device 200A includes a first set of silicon ridges 202*a* and a second set of silicon ridges 204*a*. The contact points of the ridges 202*a* and 204*a* form memory cells, such as 208.

In some implementations, the RRAM device 200A may be same as the device 100. In such implementations, the ridges 202*a* may be same as the ridges 102*a*; the ridges 204*a* may be same as the ridges 104*a*; and the memory cell 208 may be same as the memory cell 108*a* or 108*b*.

FIG. 2B shows another RRAM device 200B. As shown, in some implementations, the RRAM device 200B includes a diode 210 in each memory cell 208. The diode 210 may be a PN junction diode. Due to the all-silicon based structure of the RRAM device 200B, the PN junction diode 210 may be easily incorporated into each memory cell 208. The PN junction diode acts as a selector operable to handle "sneak path" issues that may arise in memory arrays.

The diode 210 may be incorporated within the small area footprint of the memory cell 208, without requiring expansion in the area of the cell. This stands in contrast to transistor-based memory devices, where an extra transistor is usually incorporated in each memory cell to address sneak path issues. In such devices, the addition of the extra transistor in each memory cell leads to a large circuit footprint.

In some implementations, the RRAM device 200B may be same as the device 100. In such implementations, the ridges 202*a* may be same as the ridges 102*a*; the ridges 204*a* may be same as the ridges 104*a*; and the memory cell 208 may be same as the memory cell 108*a* or 108*b*.

FIG. 2C shows a third RRAM device 200C, which includes a voltage source 212 and a ground connection 214. As shown, power may be applied to the RRAM device 200C by connecting the electrodes formed by the silicon ridges 202*a* and 204*a* to a power supply. In some implementations, the voltage may be applied to the top electrode (i.e., formed by silicon ridge 204*a*) using the voltage source 212. The bottom electrode (i.e., formed by silicon ridge 202*a*) may be connected to ground potential at 214.

The RRAM device 200C may be same as the device 100. In such implementations, the ridges 202*a* may be same as the ridges 102*a*; the ridges 204*a* may be same as the ridges 104*a*; and the memory cell 208 may be same as the memory cell 108*a* or 108*b*.

The RRAM device 200C exhibits repeatable non-volatile resistive switching behavior with low programming voltages (which may be as low as 0.5 volts) and high ON/OFF conductance ratio. The information, i.e., the value of the data bit, that is stored in the memory cell 208 may be changed by varying the voltage applied to the memory cell using the voltage source 212, such that the resistance of the switching layer at the junction of the top and bottom silicon ridges changes. In some implementations, a first value of the data bit may be stored in the cell 208 by applying a set voltage (also referred to as V$_{SET}$) to the cell 208, while a second value of the data bit may be stored by applying a reset voltage (as referred to as V$_{RESET}$) to the cell 208. The first value may be a '0' or a '1' bit value, and accordingly the second value will be the reverse bit value.

The first value may be stored by applying a predetermined set voltage such that the resistance of the switching layer at the junction of the top and bottom silicon ridges in the memory cell 208 is in a first state. The second value may be stored by applying a predetermined reset voltage such that the resistance of the switching layer at the junction of the top and bottom silicon ridges in the memory cell 208 is in a second state, where the value of the resistance in the first state is different from the value of the resistance in the second state. By measuring the value of the resistance of the memory cell 208, a memory controller may determine whether the cell is in the first resistance state or second resistance state, and consequently decide whether a '0' or a '1' is stored in the cell.

In some implementations, the shape of the ridges 202a or 202b in FIGS. 2A-2C may be different from the pyramidal cross-sectional shape. For example, the ridges may be rectangular bars, such that the ridges 202a or 202b appear as rectangles or squares in the cross-section. As another example, the ridges may be cylindrical, such that the ridges 202a or 202b appear elliptical (e.g., circles or ovals) in the cross-section.

Figure 3:
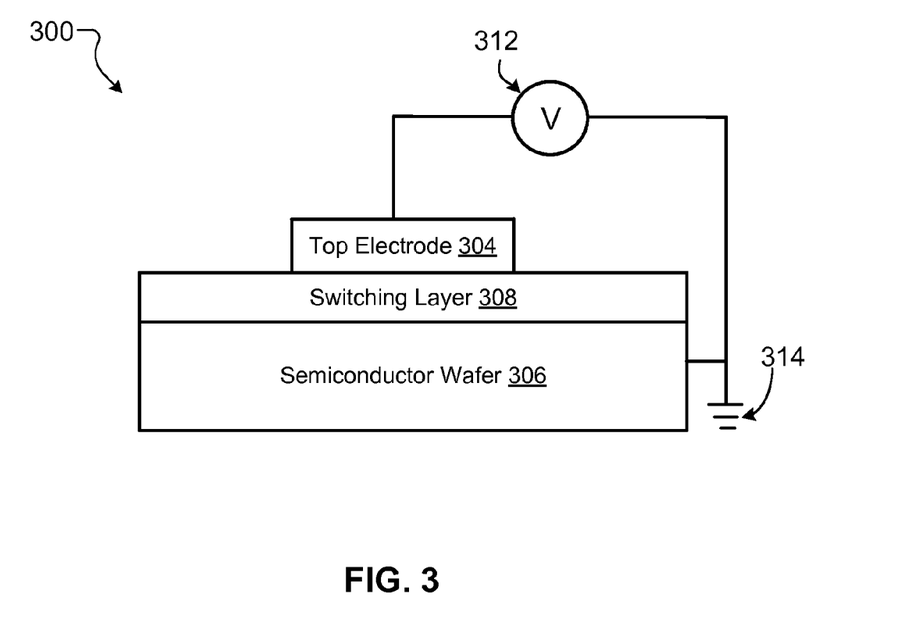
FIG. 3 is a block diagram of another example of an RRAM device.

FIG. 3 is a block diagram of another example of an RRAM device 300. The device 300 includes a top metal electrode 304, a bottom semiconductor wafer 306 and a switching layer 308 sandwiched between the electrode 304 and the wafer 306. A voltage source 312 is connected to the electrode 304, while the wafer 306 is connected to ground potential at 314.

In some implementations, the electrode 304 may be similar to one of the silicon ridges 104a, or the electrode 204a. In such implementations, the electrode 304 may be a silicon ridge that is pyramidal in shape in the cross-section, with the top of the pyramid, i.e., the sharp edge of the ridge, pointed vertically downwards and in contact with the wafer 306 through the switching layer 308.

The bottom wafer 306 may be similar to the wafer 106. For example, the wafer 306 may be a heavily doped silicon layer, such as $SiO_2$ on SOI.

The switching layer 308 may be similar to the switching layer in the device 100. The switching layer 308 may include a thin layer of an oxide of silicon (such as $SiO_x$, where x is a positive integer, or hydrogen silsesquioxane (HSQ)) formed on the surface of the top electrode 304, or the bottom wafer 306, or both. The thickness of the switching layer 308 may be in the order of 1 nanometer. The switching layer 308 may be generated in a wet chemical process (e.g., cleaning in a Piranha solution).

A memory cell is formed at the contact point of the top electrode 304 and the bottom wafer 306, with the switching layer 308 sandwiched in between. In this case, the memory cell includes a silicon ridge, i.e., 304, as the first terminal. Here the other terminal is not another silicon ridge, as is the case with the device 100 or the device 200C. Instead, the other terminal is formed by the semiconductor wafer 306. In this manner, the structure of the RRAM device 300 may be different from the RRAM devices 100 or 200C.

However, data is stored in the RRAM device 300 in a manner similar to that in the devices 100 or 200C, i.e., by varying the resistance of the switching layer 308 by applying varying set and reset voltages to the top electrode 304 through the voltage source 312, while the bottom electrode 306 is connected to ground potential at 314. Different resistance values of the switching layer 308 are measured by a memory controller as corresponding to different values of the data bit stored in the memory cell.

In some implementations, the RRAM device 300 may be fabricated with a metal top electrode 304. For example, the RRAM device 300 may include a copper (also referred to by its symbol, Cu) top electrode 304, a $SiO_x$ switching layer 308 and a Si semiconductor wafer 306, yielding a Cu/$SiO_x$/Si structure. In some of these implementations, the RRAM device 300 may have a device size ($\varphi$) in the order of 50 µm, with the Cu top electrode 304 having thickness in the order of 24 nm. In these implementations, the $V_{SET}$ for the RRAM device 300 may be lower than 0.5 volts, while the ON/OFF ratio may be larger than $10^7$, with read in the order of 0.2 volts. However, the device size, or thickness, or both, may be different in other implementations with a Cu top electrode 304. The $V_{SET}$, or the ON/OFF ratio, or both, also may be different in other implementations with a Cu top electrode 304.

In some implementations, the RRAM device 300 may include a silver (also referred to by its symbol, Ag) top electrode 304, a $SiO_x$ switching layer 308 and a Si semiconductor wafer 306, yielding an Ag/$SiO_x$/Si structure. In some of these implementations, the RRAM device 300 may have a device size ($\varphi$) in the order of 50 µm and thickness of the Ag top electrode 304 in the order of 17 nm. In such implementations, the RRAM device 300 may switch to the 'ON' state upon a positive voltage and to the 'OFF' state at a negative voltage. However, the device size, or thickness, or both, may be different in other implementations with Ag top electrode 304. Additionally, the device 300 may switch between 'ON' and 'OFF' states using a different combination of positive and negative voltages.

In some implementations, the RRAM device 300 may include a platinum (also referred to by its symbol, Pt) top electrode 304, a $SiO_x$ switching layer 308 and a Si semiconductor wafer 306, yielding a Pt/$SiO_x$/Si structure. In some of these implementations, the RRAM device 300 may have a device size ($\varphi$) in the order of 50 µm and thickness of the Pt top electrode 304 in the order of 12 nm. In such implementations, the RRAM device 300 may switch to the 'ON' state upon a negative voltage and to the 'OFF' state at a positive voltage, and the ON/OFF ratio may be in the range of several hundred. Additionally, in such implementations, $V_{SET}$ may be greater than $V_{RESET}$. However, the device size, or thickness, or both, may be different in other implementations with a Pt top electrode 304. Also, in other implementations with a Pt top electrode 304, the device 300 may switch to 'ON' and 'OFF' states using a different combination of positive and negative voltages, or the device may have a different ON/OFF ratio, or the $V_{SET}$ may be less than $V_{RESET}$, or some suitable combination of these.

In some implementations, the RRAM device 300 may include a palladium (also referred to by its symbol, Pd) top electrode 304, a $SiO_x$ switching layer 308 and a Si semiconductor wafer 306, yielding a Pd/$SiO_x$/Si structure. In some of these implementations, the RRAM device 300 may have a device size ($\varphi$) in the order of 50 µm and thickness of Pd top electrode 304 may be in the order of 13 nm. In such implementations, the RRAM device 300 may switch to 'ON' state upon a positive voltage and to the 'OFF' state at a negative voltage, and $V_{SET}$ may be greater than $V_{RESET}$. However, the device size, or thickness, or both, may be different in other implementations with a Pd top electrode 304. Also, in other implementations with a Pd top electrode 304, the device 300 may switch to 'ON' and 'OFF' states using a different combination of positive and negative voltages, or the VSET may be less than VRESET, or some suitable combination of these.

In some implementations, the RRAM device 300 may include a tungsten (also referred to by its symbol, W) top electrode 304, a $SiO_x$ switching layer 308 and a Si semiconductor wafer 306, yielding a W/$SiO_x$/Si structure. In some of these implementations, the RRAM device 300 may have a device size ($\varphi$) that is in the range of 10 µm or less and with W probes that are directly used as the top electrode 304. In such implementations, the RRAM device 300 may switch to the 'ON' state upon a positive voltage and to the 'OFF' state at a negative voltage, and $V_{SET}$ may be greater than $V_{RESET}$. However, the device size may be different in other implementations with a W top electrode 304. Also, in other implementations with a W top electrode 304, the device 300 may switch to 'ON' and 'OFF' states using a different combination of positive and negative voltages, or the VSET may be less than VRESET, or some suitable combination of these.

Different metals may be used as the top electrode 304 for different uses. For example, active metals such as Ag and Cu may be used as the top electrode 304 such that the RRAM devices 300 may be set at positive voltages, and reset at negative voltages. In these cases, $V_{SET}$ may be less than $V_{RESET}$ for some implementations. Refractory metals such as Pt, Pd and W may used as the top electrode 304 such that the RRAM devices 300 may be set at either polarity. In these cases, $V_{SET}$ may be greater than $V_{RESET}$ for some implementations.

Accordingly, for different RRAM devices 300 with different metal top electrodes, the switching mechanisms may be different. This may be the case, for example, because for RRAM devices 300 with active metal electrodes such as Ag and Cu (also referred to as Group A devices), the switching may be governed by the movement of mobile ions. However, for devices with refractory metal such as Pt, Pd and W (also referred to as Group B devices), the switching may be related to the formation of silicon nanocrystals inside the thin $SiO_x$ layer under Joule heating.

The polarity and amplitude of $V_{SET}$ and $V_{RESET}$ for the RRAM device 300 described above supports the above observation. For Group A devices, a positive $V_{SET}$ can drive the positive mobile ions (e.g., $Ag^+$, $Cu^+$) from the metal/$SiO_x$ interface to the Si/$SiO_x$ interface to from a conductive filament (CF). Once a bridge (i.e., CF) is formed, a negative voltage may be used to rupture the CF to turn the device to the 'OFF' state. Compared with the original $SiO_x$ layer, the RRAM device 300 at the 'ON' state has a lower resistance. As a result, a higher $V_{RESET}$ value may be used so that the amount of the voltage applied on the CF is high enough to turn the RRAM device 300 to the 'OFF' state.

On the other hand, for Group B devices (e.g., with refractory metal such as Pt, Pd and W used as the top electrode 304), either polarity may turn the RRAM device 300 to the 'ON' state. This is because regardless of the polarity, the voltage on the RRAM device 300 can generate a current and thereby Joule heating that will facilitate the formation of silicon nanocrystals inside of the $SiO_x$. The reason why $V_{SET}$ may be larger than $V_{RESET}$ for Group B devices may be explained by the free energy of the following reaction:

$Si+O_2 \rightarrow SiO_2$, where $\Delta G° = -856.97$ kJ/mol

A negative $\Delta G°$ suggests that the above reaction is energy favorable. That is, the formation of Si nanocrystal may involve more energy than the formation of $SiO_x$. Accordingly, the value of $V_{SET}$ may be larger than $V_{RESET}$ for Group B devices for some implementations.

Figure 4:
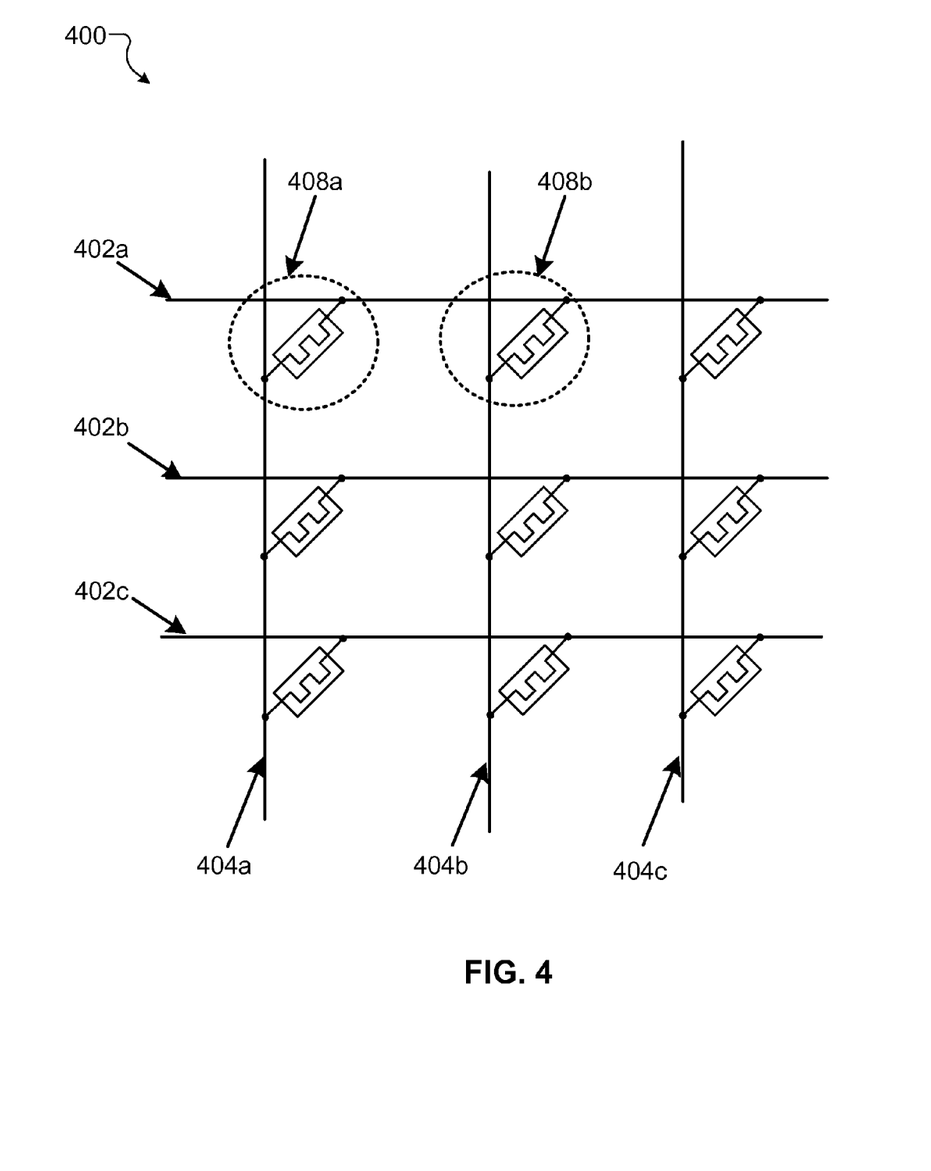
FIG. 4 is a circuit diagram of an example RRAM array showing wordlines, bitlines and resistive memory cells.

FIG. 4 is a circuit diagram of an example RRAM array 400 showing wordlines, bitlines and resistive memory cells. The RRAM array 400 includes wordlines 402a, 402b and 402c; bitlines 404a, 404b and 404c; and memory cells 408a and 408b.

The memory cells 408a and 408b are formed at the junction of the wordlines 402a, 402b and 402c and the bitlines 404a, 404b and 404c. Although only two memory cells are labeled, a memory cell may be formed at each junction of a wordline and a bitline. The wordlines 402a, 402b and 402c, or the bitlines 404a, 404b and 404c, or both, may be connected to a voltage source and/or a ground potential for applying varying voltages to the memory cells such that the resistance of the memory cells are varied between different states. In this manner, different bit values are stored in the memory cells.

The RRAM array 400 may be an all-silicon based device. For example, in some implementations the RRAM array 400 may be similar to the RRAM device 100. In such implementations, the wordlines 402a, 402b and 402c may be similar to the silicon ridges 102a; and the bitlines 404a, 404b and 404c may be similar to the silicon ridges 104a. The memory cells 408a and 408b may be similar to the memory cells 108a and 108b. Accordingly, the memory cell 408a may include the wordline 402a and the bitline 404a as its two terminals, while the memory cell 408b may include the wordline 402a and the bitline 404b as its two terminals.

Each of the memory cells 408a or 408b also may include, between the two terminals, a thin layer of switching material that is composed of an oxide of silicon. As described above, by varying the voltage that is applied to the wordlines 402a, 402b and 402c, and/or the bitlines 404a, 404b and 404c, the resistance of the switching layer may be changed, such that the memory cell 408a or 408b is in different resistance states corresponding to different bit values.

Memory controllers connected to the bitlines, or the wordlines, or both, may measure the resistance of each memory cell 408a or 408b. The memory controllers may map the measured resistance to different states and correspondingly determine the bit value stored in each memory cell based on the mapped resistance state for that memory cell.

Figure 5:
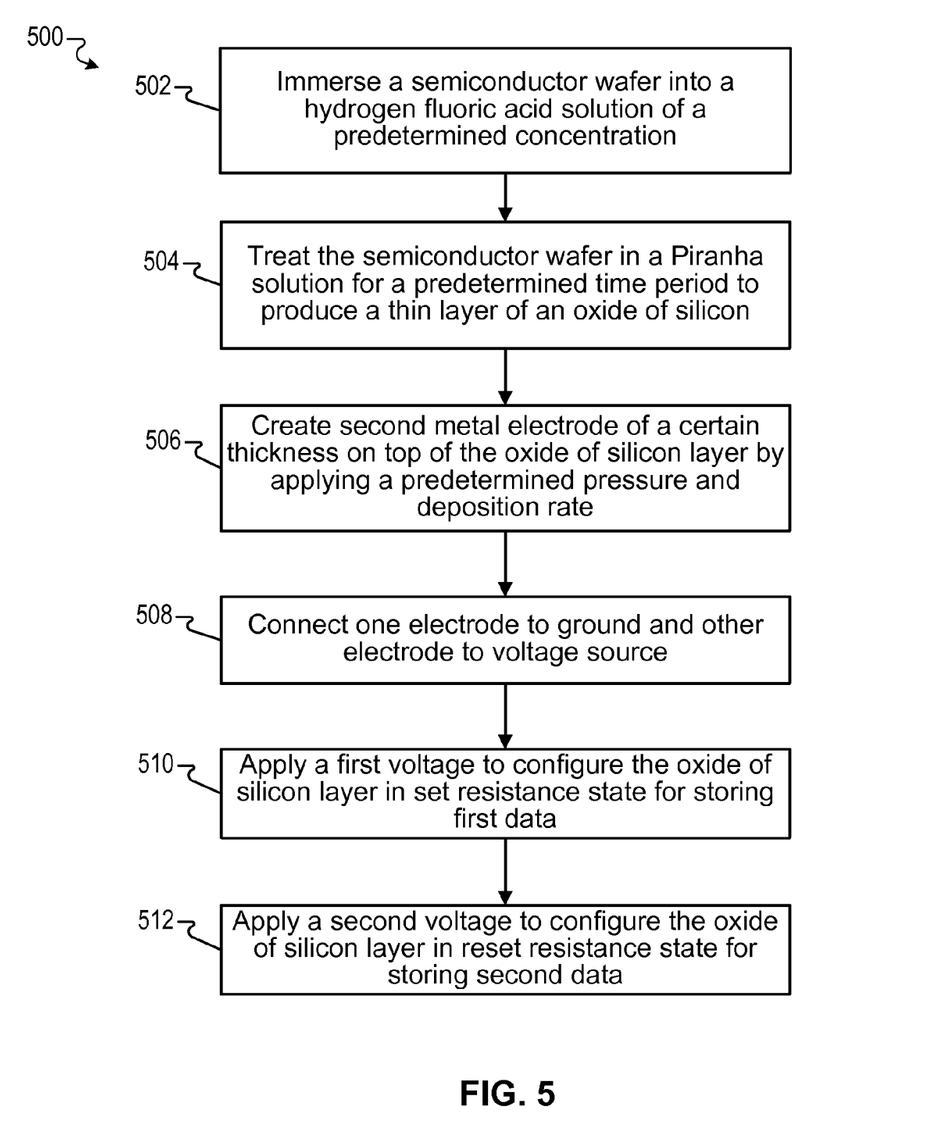
FIG. 5 is a flow chart illustrating an example of a process for manufacturing an RRAM device.

FIG. 5 is a flow chart illustrating an example of a process 500 for manufacturing an RRAM device. For example, the process 500 may be used for manufacturing the RRAM device 100. Accordingly, the following section describes the process 500 as performed in the context of fabrication of the RRAM device 100. However, the process 500 may be used for other RRAM devices, systems or system configurations.

The process 500 may be implemented as a set of instructions that are stored in a storage medium, e.g., semiconductor memory or a hard disk. The set of instructions may be executed by one or more processors for performing the operations associated with the process 500.

At 502, a semiconductor wafer is immersed into a hydrogen fluoric (HF) acid solution of a predetermined concentration. For example, a highly doped prime grade silicon wafer is dipped into a HF acid solution to remove the native oxide. The doped silicon wafer may be a $SiO_2$ on SOI wafer, such as the wafer 106. In some implementations, the wafer may be a P-type wafer having a characteristic of 1-5 milli-ohms (mΩ) per centimeter. The predetermined concentration of the HF acid solution may be 1:50 diluted HF acid.

In some implementations, a first set of silicon ridges, such as the ridges 102a, may be formed on the semiconductor wafer at this stage. However, in other implementations, the first set of silicon ridges, such as the ridges 102a, may be formed by further treatment of the semiconductor wafer. In yet other implementations, the first set of silicon ridges, such as the ridges 102a, are not formed. In such implementations, the semiconductor wafer treated as described above is used as the bottom electrode or terminal for the resulting RRAM device.

At 504, the semiconductor wafer is treated in a Piranha solution for a predetermined time period to produce a thin layer of an oxide of silicon. For example, the wafer 106 may be treated in a Piranha solution to produce a thin layer of silicon oxide ($SiO_x$).

In some implementations, the Piranha solution includes a mixture of sulfuric acid ($H_2SO_4$) and hydrogen peroxide ($H_2O_2$) in a 3:1 volume ratio. However, in other implementations, some other ratio, or other compounds, or other solution, may be used. For example, $H_2SO_4$:$H_2O_2$ in a 5:1 volume ratio may be used.

In some implementations, the predetermined time period may be in the order of 20 minutes. However, in other implementations, a different time period may be used. For example, the time period may be varied between 10 and 50 minutes in different implementations.

In some implementations, different wet chemical parameters (that is, chemical composition, etching time, etc.) for the Piranha cleaning process may be used to form the switching layer. In such implementations, prime grade silicon wafers with high dopant concentration (e.g., 1-5 mΩ cm, p-type, (100) wafers) may be cleaned with a Piranha solution in which the $H_2SO_4$:$H_2O_2$ volume ratio, or the time period, or both, are varied. However, despite such variations in the process parameters, the thickness of the oxide layer may be the same.

In some implementations, the thickness of the layer of the oxide of silicon may be in the order of 1 nanometer. Apart from $SiO_x$, other oxides may be used, such as hydrogen silsesquioxane (HSQ), or some other suitable oxide. As described previously, the thin layer of the oxide of silicon is used as the switching material for the RRAM device fabricated using the process 500.

In some implementations, the thin layer of the oxide of silicon may be formed on a first set of silicon ridges, such as the ridges 102*a*. However, in other implementations, the thin layer of the oxide of silicon may be formed directly on the surface of the semiconductor wafer.

At 506, a second metal electrode of a certain thickness is created on top of the layer of the oxide of silicon by applying a predetermined pressure and deposition rate. For example, in some implementations, the second set of silicon ridges 104*a* may be formed on top of the first set of silicon ridges 102*a* that has a thin layer of a silicon oxide covering the sharp edges of the ridges 102*a*. In some other implementations, the second set of silicon ridges 104*a* may be formed directly on top of the cleaned semiconductor wafer 106 that has a layer of a silicon oxide deposited on its surface.

As described previously, in some implementations, metals other than silicon may be used as the top electrode, such as platinum (Pt), copper (Cu), silver (Ag), palladium (Pd), or tungsten (W). The RRAM device may be either unipolar or bipolar depending on the choice of top electrode material. For example, RRAM devices with inert metal (such as Pt) top electrodes may exhibit unipolar switching behavior, and the switching may occurred on both polarities. On the other hand, devices with active metal electrodes (such as Cu) may exhibit bipolar switching behavior. The switching behavior, either unipolar or bipolar depending on the choice of metal for the top electrode (e.g., one of Cu, Ag, Pt, Pd or W), may be repeatable.

The thickness of the second metal electrode may be in the range of 12 to 24 nanometers. In some implementations, the second metal electrode may be deposited as a metal disk with a diameter in the range of 25 to 200 microns.

In some implementations, the second metal electrode may be deposited using an electron beam evaporator through metal shadow masks. The predetermined pressure may include a base pressure in the range of $7 \times 10^{-7}$ torr. The predetermined deposition rate may be in the range of 0.2 angstrom per second for platinum, or 1.0 angstrom per second for copper.

Accordingly, the RRAM device fabricated in the above manner includes a heavily doped silicon wafer, a thin $SiO_x$ switching layer (having a thickness in the range of 1 nanometers) produced in the wet chemical process, and a metal top electrode. The heavily doped silicon wafer may function as the bottom electrode in some implementations, while in other implementations, silicon ridges formed on the silicon wafer function as the bottom electrode. The metal top electrode may be silicon ridges as well.

At 508, one electrode is connected to ground and other electrode is connected to a voltage source. For example, the set of silicon ridges 102*a* may be connected to a ground potential (such as at 214) while the set of silicon ridges 104*a* may be connected to a voltage source (such as 212).

At 510, a first voltage is applied to configure the layer of the oxide of silicon in set resistance state for storing first data. For example, a set voltage may be applied to the set of silicon ridges 104*a* to change the resistance of the $SiO_x$ switching layer in between the ridges 102*a* and 104*a* to a predetermined first resistance that corresponds to a set state. In some implementations, the RRAM device may store a '1' bit value as first data in the set state, while in other implementations, the RRAM device may store a '0' bit value as first data in the set state.

In some implementations, the first voltage may be in the range of −2.6 volts to +0.5 volts. The voltage that is applied to configure the switching layer in the set state may depend on the metal used as the top electrode, or the bottom electrode, or both. For example, for platinum as the top electrode, the set voltage is in the range of −2.6 volts. However, for copper as the top electrode, the set voltage is in the range of +0.5 volts.

At 512, a second voltage is applied to configure the layer of the oxide of silicon in reset resistance state for storing second data. For example, a reset voltage may be applied to the set of silicon ridges 104*a* to change the resistance of the $SiO_x$ switching layer in between the ridges 102*a* and 104*a* to a predetermined second resistance that corresponds to a reset state.

The second data may be the reverse of the first data. In some implementations, the RRAM device may store a '0' bit value as second data in the reset state, while in other implementations, the RRAM device may store a '1' bit value as second data in the reset state.

In some implementations, the second voltage may be in the range of −0.9 volts to −1.3 volts. The voltage that is applied to configure the switching layer in the set state may depend on the metal used as the top electrode, or the bottom electrode, or both. For example, for platinum as the top electrode, the reset voltage is in the range of −0.9 volts. However, for copper as the top electrode, the reset voltage is in the range of −1.3 volts. The ranges of the set and reset voltages indicate that different switching mechanisms govern the switching behaviors for devices with different metal electrodes.

The low values of the first and second voltages may be attributed to the unique structure of the fabricated RRAM device, which includes a thin layer of the oxide of silicon sandwiched between two metal (e.g., silicon) electrodes. In some implementations, the second, i.e., reset, voltages may be greater than the first, i.e., set, voltages. This may be the case, for example, due to the physical characteristics of the oxide switching layer.

In some implementations, the first or the second resistance may be independent of the dimensions of the top electrode, or the bottom electrode, or both. For example, the first resistance may be in the range of $10^2$ ohms and the second resistance may be in the range of $10^5$ ohms with platinum as the top electrode, independent of whether the dimension of the platinum top electrode disk is 50, 75 or 100 microns.

As described in the preceding sections, all-silicon based RRAM devices may be designed that use low programming voltages and exhibit repeatable non-volatile switching behavior. This is facilitated by the fabrication of a thin layer of an oxide of silicon produced during Piranha process that is used as the switching material for the resistive memory device. The simplicity of the device fabrication, as shown by the process 500, and the choice of the materials make these RRAM devices compatible with the current CMOS infrastructure. The fact that these devices can be switched at low voltages allows them to be integrated with state-of-the-art ultralow power CMOS circuits.

The disclosed and other examples can be implemented using, or as, one or more computer program products, i.e., one or more modules of computer program instructions encoded on a computer readable medium for execution by, or to control the operation of, data processing apparatus. The implementations can include single or distributed processing of algorithms. The computer readable medium can be a machine-readable storage device, a machine-readable storage substrate, a memory device, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A system may encompass all apparatus, devices, and machines for processing data, including by way of example a programmable processor, a computer, or multiple processors or computers. A system can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed for execution on one computer or on multiple computers that are located at one site or distributed across multiple sites and interconnected by a communications network.

The processes and logic flows described in this document can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer can include a processor for performing instructions and one or more memory devices for storing instructions and data. Generally, a computer can also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data can include all forms of nonvolatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

While this document may describe many specifics, these should not be construed as limitations on the scope of an invention that is claimed or of what may be claimed, but rather as descriptions of features specific to particular embodiments. For example, a communications channel may include the Web, where a user may interact with an interaction site via a webpage generated dynamically according to the interaction flow. As another example, a communications channel may include a smart phone application, where a user may interact with an interaction site by starting a smart phone application, and the smart phone application then contacts the interaction site and provides a communications interface between the user and the interaction site. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. A memory device comprising:
   one or more first semiconductor ridges coupled to a first semiconductor wafer using contact pads, wherein the first semiconductor ridges are configured to be wordlines;
   one or more second semiconductor ridges coupled to a second semiconductor wafer using contact pads and placed orthogonally on top of the first semiconductor ridges forming a crossbar structure, with sharp edges of the first semiconductor ridges coupled to sharp edges of the second semiconductor ridges, wherein the second semiconductor ridges are configured to be bitlines and wherein each area of coupling of a first semiconductor ridge and a second semiconductor ridge is configured to be a memory cell;

a compound layer covering the sharp edges of at least one of the first semiconductor ridges or the second semiconductor ridges, wherein the compound layer is configured to be a switching layer;

a ground connection coupled to the first semiconductor ridges; and a voltage source coupled to the second semiconductor ridges for application of a switching voltage to the compound layer, wherein each memory cell is operable to be in a set state by application of a first voltage and operable to be in a reset state by application of a second voltage using the voltage source and the ground connection.

2. The memory device of claim 1, wherein at least one of the first semiconductor ridges or the second semiconductor ridges include silicon ridges.

3. The memory device of claim 1, wherein at least one of the first semiconductor wafer or the second semiconductor wafer includes silicon dioxide ($SiO_2$) on silicon-on-insulator (SOI) wafer.

4. The memory device of claim 1, wherein the compound layer is one of a silicon oxide ($SiO_x$) layer or a hydrogen silsesquioxane (HSQ) layer.

5. The memory device of claim 1, wherein the semiconductor contact pads include silicon contact pads.

6. The memory device of claim 1, wherein the second semiconductor ridges are formed of metal that is selected from the group consisting of platinum (Pt), copper (Cu), silver (Ag), palladium (Pd) or tungsten (W).

7. The memory device of claim 1, wherein the compound layer has a thickness in an order of 1 nanometer.

8. The memory device of claim 7, wherein the first voltage is in a range of −2.6 volt to +0.6 volt, and the second voltage is in a range of −1.3 volt to −0.9 volt.

9. The memory device of claim 1, wherein an area of a memory cell is in a range of $4F^2$, wherein F is a minimum feature size.

10. A memory device comprising:

one or more first ridges formed on a first semiconductor wafer, wherein the first ridges are formed using a semiconductor material and are configured to be first electrodes;

one or more second ridges that are placed orthogonally on top of the first semiconductor ridges forming a crossbar structure, with sharp edges of the first ridges coupled to sharp edges of the second ridges, wherein the second ridges are configured to be second electrodes and each area of coupling of a first ridge and a second ridge is configured to be a memory cell; and a compound layer covering the sharp edges of at least one of the first ridges or the second ridges, wherein the compound layer is configured to be a switching layer, wherein a resistance of the switching layer corresponding to a first memory cell is configured to be in a first state by applying a first set of voltages to a first ridge and a second ridge associated with the first memory cell and the resistance of the switching layer is configured to be in a second state by applying a second set of voltages to the first ridge and the second ridge associated with the first memory cell, wherein the first memory cell is configured to store a first value when the resistance of the switching layer is in the first state and the first memory cell is configured to store a second value when the resistance of the switching layer is in the second state.

11. The memory device of claim 10, further comprising a memory controller that is configured to:

measure the resistance of the switching layer that is associated with the first memory cell; and based on measuring the resistance of the switching layer, determine whether the first value or the second value is stored in the first memory cell.

12. The memory device of claim 10, wherein the second ridges are formed using one of a semiconductor material or a metal, wherein the semiconductor material is silicon (Si), and wherein the metal is one of platinum (Pt), copper (Cu), silver (Ag), palladium (Pd) or tungsten (W).

* * * * *